United States Patent [19]
Wynn

[11] 4,318,186
[45] Mar. 2, 1982

[54] MAGNETIC BUBBLE MEMORY WITH DETECTOR

[75] Inventor: Woodson D. Wynn, Basking Ridge, N.J.

[73] Assignee: Bell Telephone Laboratories, Incorporated, Murray Hill, N.J.

[21] Appl. No.: 162,171

[22] Filed: Jun. 23, 1980

[51] Int. Cl.³ .............................................. G11C 19/08
[52] U.S. Cl. ....................................................... 365/8
[58] Field of Search ...................... 365/8, 158; 360/41

[56] References Cited

U.S. PATENT DOCUMENTS

| | | | |
|---|---|---|---|
| 3,813,660 | 5/1974 | Buhrer | 365/8 |
| 3,815,108 | 6/1974 | McGrath | 360/41 |
| 3,952,291 | 4/1976 | Bailey et al. | 365/8 |
| 4,194,223 | 3/1980 | Marino | 360/41 |

*Primary Examiner*—James W. Moffitt
*Attorney, Agent, or Firm*—Herbert M. Shapiro

[57] ABSTRACT

A magnetic bubble memory herein includes a detection circuit which responds to changes in data signal which occur in consecutive detection intervals. In one embodiment changes from both 0 to 1 and from 1 to 0 are used. Improved operating margins result. Correlated coding techniques are shown to preclude propagation of errors.

9 Claims, 5 Drawing Figures

EXAMPLE OF CORRELATED CODING $\{a_k\}$:

| $a_0$ | $a_1$ | $a_2$ | $a_3$ | $a_4$ | $a_5$ | $a_6$ | $a_7$ | $a_8$ | $a_9$ | $a_{10}$ | ... |
|---|---|---|---|---|---|---|---|---|---|---|---|
| 1 | 1 | 0 | 0 | 1 | 0 | 1 | 1 | 0 | 1 | 0 | ... |

$\{b_k\} = \{a_k \oplus b_{k-1}\}$:

| $b_{-1}$ | $b_0$ | $b_1$ | $b_2$ | $b_3$ | $b_4$ | $b_5$ | $b_6$ | $b_7$ | $b_8$ | $b_9$ | $b_{10}$ | ... |
|---|---|---|---|---|---|---|---|---|---|---|---|---|
| 0 | 1 | 0 | 0 | 0 | 1 | 1 | 0 | 1 | 1 | 0 | 0 | ... |

$\{B_k\}$:

$\{C_k\} = \{B_k - B_{k-1}\}$:

$\{\hat{c}_k\}$:

| $c_0$ | $c_1$ | $c_2$ | $c_3$ | $c_4$ | $c_5$ | $c_6$ | $c_7$ | $c_8$ | $c_9$ | $c_{10}$ | ... |
|---|---|---|---|---|---|---|---|---|---|---|---|
| 1 | -1 | 0 | 0 | 1 | 0 | -1 | 1 | 0 | -1 | 0 | ... |

$\{\hat{a}_k\} = \{(\hat{c}_k)_{\mod 2}\}$:

| $\hat{a}_0$ | $\hat{a}_1$ | $\hat{a}_2$ | $\hat{a}_3$ | $\hat{a}_4$ | $\hat{a}_5$ | $\hat{a}_6$ | $\hat{a}_7$ | $\hat{a}_8$ | $\hat{a}_9$ | $\hat{a}_{10}$ | ... |
|---|---|---|---|---|---|---|---|---|---|---|---|
| 1 | 1 | 0 | 0 | 1 | 0 | 1 | 1 | 0 | 1 | 0 | ... |

MAGNETIC BUBBLE MEMORY WITH DETECTOR

FIELD OF THE INVENTION

This invention relates to magnetic bubble memories and more particularly to circuitry for detecting outputs from such memories.

BACKGROUND OF THE INVENTION

The reliable detection of stored binary data from any digital memory, while integral to successful application, can be a nontrivial task. Detection is performed by making binary decisions about the status of analog signal outputs from the memory in response to stored bits. It is not unusual that the memory signals available in the detection process are of low level and are subject to parametric variations and noise due to the physics of the memory technology and the manner of application. If the signals for a given memory type have significant variations across an ensemble of devices due to manufacturing differences or with changes in operating conditions, it may not be possible to recover data reliably with a nonadaptive detector. However, an adaptive detector can have an undesirable adaptation time requirement and can be complex and expensive.

In magnetic bubble memories, detection is particularly difficult due to the presence of a magnetic field which reorients in the plane of bubble movement in a well-understood manner. This "drive" field causes cyclical background noise in the detector. Further, changes in operating characteristics occur because of the material used for the layer in which bubbles move. Bubble memories in which bubbles move in response to such a drive field are called "field access" memories. Specifically, in some field access magnetic bubble memories (MBM), detection of stored binary data on a memory chip is accomplished by processing voltages that are measured across a matched pair of permalloy magnetoresistive sensor strips. Ideally, these sensors are subjected to the same magnetic, electrical, and environmental conditions with the exception that only one, an active sensor, is subjected to the (magnetic) H-fields of traversing bubble domains. Then the difference signal, typically between 1 and 10 millivolts, induced by a bubble across a sensor pair is detectable.

In practice, there are interference effects in the sensor outputs predominantly from control function drive signals, incomplete common mode rejection of H-field pickup, magnetoresistive switching noise, interference between bubble domains near the active sensor, and environmental effects such as chip temperature. Also, random thermal noise from the sensors, as well as thermal and shot noise from external detection electronics, are present in the observable differential sensor response.

In the drive field period of a field access MBM chip, there exists by design at least one time interval, defined here as the Detection Interval (D.I.), in which the sensor differential response is relatively free of inherent signal interference, and where a detectable difference should exist between responses for bubble and no-bubble cycles. For any MBM chip type, optimum determination of the D.I. relative to the drive field vector, and adherence to it when processing the sensor signals for data recovery, can be critical to successful memory performance.

Variations in the manufacture of a large ensemble of the same type of field access MBM chips with permalloy sensors can result in undesirable variations in signal shape, time of occurrence, and intensity of the differenced sensor outputs within any D.I. for both bubble and no-bubble responses. This can occur even when each chip of the ensemble is subjected to identical operating conditions such as a given D.I., field drive, chip temperature, recorded data pattern, etc. In addition, for any particular MBM chip of an ensemble, significant variations can occur in the differenced sensor outputs in any D.I. as a consequence of variations in field drive characteristics, bubble interaction at the sensor, and chip sensor temperature changes.

A complete parametric description of the family of sensor signals that are present for any MBM chip type has been intractable. Some general sensor signal variations that have been of major concern in previous nonadaptive MBM detectors are the sensor response negative temperature coefficient and the time shift of the dominant bubble response transition that occurs with drive field variations. In a detector with a fixed D.I. where the sensor response transition is compared to a fixed threshold, these two effects are intolerable.

Detectors can be designed that adapt to the variations in data 1 and 0 (Bubble-No Bubble) response characteristics when these variations preclude the use of a simple fixed threshold detector. For example, detector amplifier gain can be temperature-compensated to track the output signal variation due to permalloy magnetoresistive sensor sensitivity to temperature. However, adaptive detectors have the disadvantages of added circuit complexity and adaptation time.

BRIEF DESCRIPTION OF THE INVENTION

The present invention is based on the hypothesis that some signal statistic, such as peak-to-peak transition or signal energy, is available in the D.I., such that the minimum statistic change between unlike data pairs is greater than the maximum statistic change between like data pairs in contiguous memory detection cycles. This condition must hold over the expected range of environmental changes in the sensor outputs for the chip ensemble that is to operate with the detector.

In a preferred embodiment, the conventional organization of a bubble detector and a dummy detector arranged in a familiar bridge network is connected to a differential amplifier. The amplifier provides first and second outputs in response to first and second differences between the outputs of the bubble detector and the dummy detector. The output of the amplifier is dc-restored to provide a reference level and applied to an input of a peak detector. The output of the peak detector is applied to inputs of odd and even sample and hold circuits operative to apply peak signals from two consecutive cycles of the bubble drive field to inputs to a second differential amplifier. The output of the second differential amplifier is connected to inputs of first and second comparators with positive and negative thresholds, respectively. The comparators apply outputs indicative of positive or negative changes between consecutive peak signals or of no-change between consecutive peak signals to inputs to an AND circuit.

DETAILED DESCRIPTION

Figure 1:
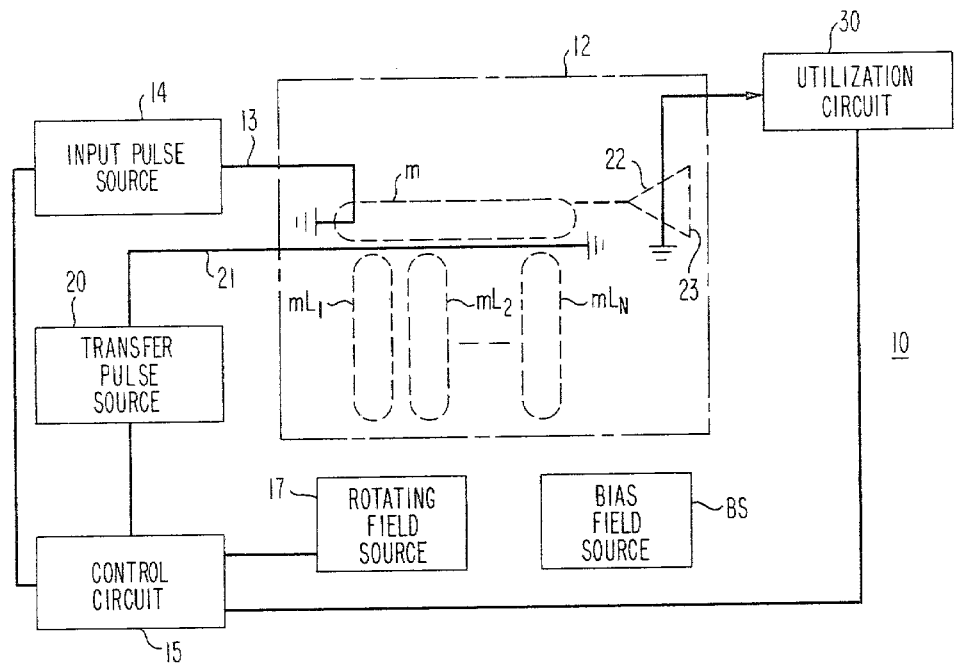
FIG. 1 is a block diagram of a magnetic bubble memory with a detection circuit in accordance with this arrangement.

FIG. 1 shows a magnetic bubble memory 10, including a layer of material 12 in which magnetic bubbles can be moved. The bubbles move along paths, usually defined by permalloy elements or ion-implanted regions, and organized in a major-minor configuration as is well known. The major-minor configuration is represented by the closed dotted ovals designated $ML_1$, $ML_2$, ... $ML_N$ and a relatively larger oval M. Ovals $ML_N$ represent closed loop paths called minor loops, and M represents the bubble-accessing path called the major loop.

Magnetic bubbles are generated in the major loop by a pulse applied to conductor 13 by input pulse source 14 under the control of control circuit 15. Bubble movement in layer 12 occurs in response to a magnetic field reorienting in the plane of layer 12 and generating moving magnetic pole configurations in the permalloy elements or ion-implanted regions which define the bubble path. The magnetic drive field is provided by rotating field source 17 also under the control of control circuit 15.

For each cycle of the reorienting field, source 14 applies a pulse (or no pulse) to conductor 13, thus generating a bubble pattern for movement along major loop M. When the bubble pattern arrives at positions in the major loop which are closely spaced from ends of the minor loops, a transfer pulse source 20 applies a pulse to a transfer conductor 21, causing movement of the pattern to positions in the minor loops. The major loop is now clear of data, entered by pulses on conductor 13, and ready to receive new input data.

The data so stored are retrieved by supplying a sufficient number of drive field cycles to move the data around the minor loops until the data again occupy positions at the ends of the loops which are in close proximity to the major loop. At that junction in time, source 20 pulses conductor 21 in a manner to cause transfer out of the addressed positions again under the control of control circuit 15. The data are now in major loop M moving towards expander-detector 22 to detector element 23.

Figure 2:
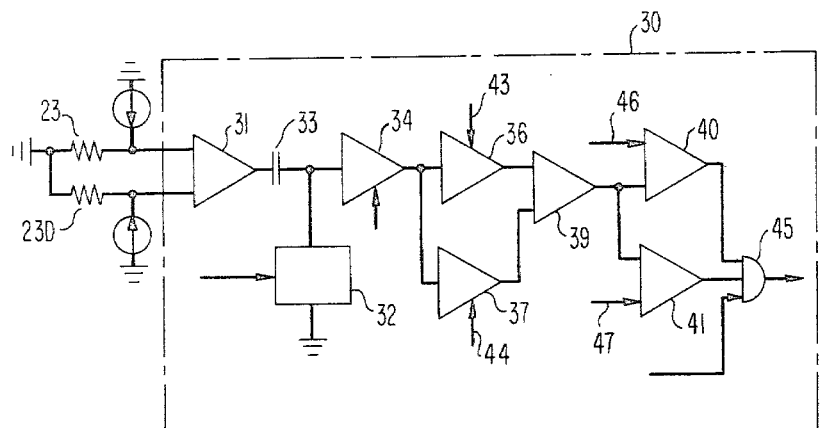
FIG. 2 is a block diagram of the detection circuit of FIG. 1.

Detector element 23 and a dummy detector (not shown in FIG. 1) are connected between ground as shown and a utilization circuit represented by block 30. FIG. 2 shows schematically the functional blocks of circuit 30, as well as both detector 23 and its dummy $23_D$. The data pattern formed by pulses in conductor 13, stored in minor loops $ML_k$, and now retrieved during a read operation of memory 10, generate voltages in detector 23 which are applied to circuit 30. Dummy detector $23_D$ commonly is connected with detector 23 in a bridge network designed to reduce the effects of the drive field on detector 23.

Bubble propagation occurs in the presence of a magnetic bias field of a polarity and strength to maintain a bubble at a nominal operating diameter. FIG. 1 shows a block BS representing such a source.

We will now direct our attention to the nature of the signals generated by the data at detector 23, the strategy for detecting those signals, and the circuit arrangement of FIG. 2 for implementing that strategy.

In each magnetic bubble memory rotating (or drive) field cycle, there exists at least one interval in which a differential sensor response is free of much of the signal interference characteristic of field access bubble memories. During that interval, a detectable difference between responses for the presence and absence of a bubble during the associated cycle is expected. For existing detection circuits, the interval is about 20% of the drive field period. Even in this interval, interference due, for example, to drive element variations and temperature changes modulate the amplitude and shape of the nominal responses.

Figure 3:
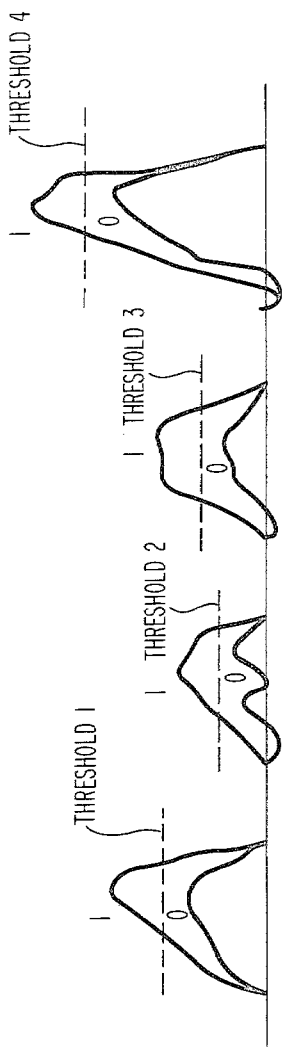
FIG. 3 is a graph of typical bubble memory outputs for detection by the circuit of FIG. 2.

FIG. 3 shows typical examples of differential responses within the detection interval for a number of bubble memories. All responses are referenced (dc restored) to ground at the start of the detection interval. The broken horizontal lines in FIG. 3 represent threshold levels for a detector to detect 1's selectively; it is clear that a detector that bases a decision on threshold comparison of clamped 1 and 0 responses in the interval cannot have a fixed threshold for a number of memories.

There are four possible states that can exist for contiguous cycles of memory responses; 1-1, 1-0, 0-1, and 0-0, where a binary 1 indicates the presence of a bubble, and a binary 0 indicates the absence of a bubble. Direct difference encoding is accomplished by adopting the convention that a binary 1 represents a bubble to no-bubble transition (or vice versa) in adjacent cycles of operation, and a binary 0 represents no change. This encoding strategy allows detection with a fixed threshold-fixed parameter detection circuit if the absolute values of the largest response differences observed for contiguous pairs of 1's or pairs of 0's are always less than the smallest differences possible between transition state responses; a constraint which is met by magnetic bubble memories.

FIG. 2 shows a functional diagram of an illustrative detection circuit 30 for detecting direct difference encoded responses from a bubble memory. The on-chip bubble detector 23 of FIG. 1 is represented as an impedance similarly designated in FIG. 2. The associated dummy detector is designated $23_D$. The detectors are shown connected between ground and the inputs to a first differential amplifier 31. This amplifier provides gain for the memory detector outputs and is adapted to reject common mode signals and minimize out-of-band noise. The input impedance for the amplifier is assumed to be large relative to impedance 23 and $23_D$ to reduce gain variations when changes occur in the sensor resistance.

The output of amplifier 31 is connected via capacitor 33 to ground via switch 32 and to the input of peak detector 34. The input impedance of the peak detector also is large so that the drain current from capacitor 33 does not introduce a voltage drop across the capacitor that is significant when compared to the restored signal during a time interval in which restoration is desired.

The output of the peak detector is connected to inputs of first and second sample and hold circuits 36 and 37, which are activated during alternate cycles of operation via inputs 43 and 44, respectively. The outputs of the sample and hold circuits are connected to inputs of a second differential amplifier 39. The output of amplifier 39 is connected to inputs of comparators 40 and 41 where the comparator references are threshold inputs 46 and 47. The outputs of the comparators are connected to inputs of an AND circuit 45. Circuit 45 provides a direct encoded output in accordance with the principles of this invention.

Figure 4:
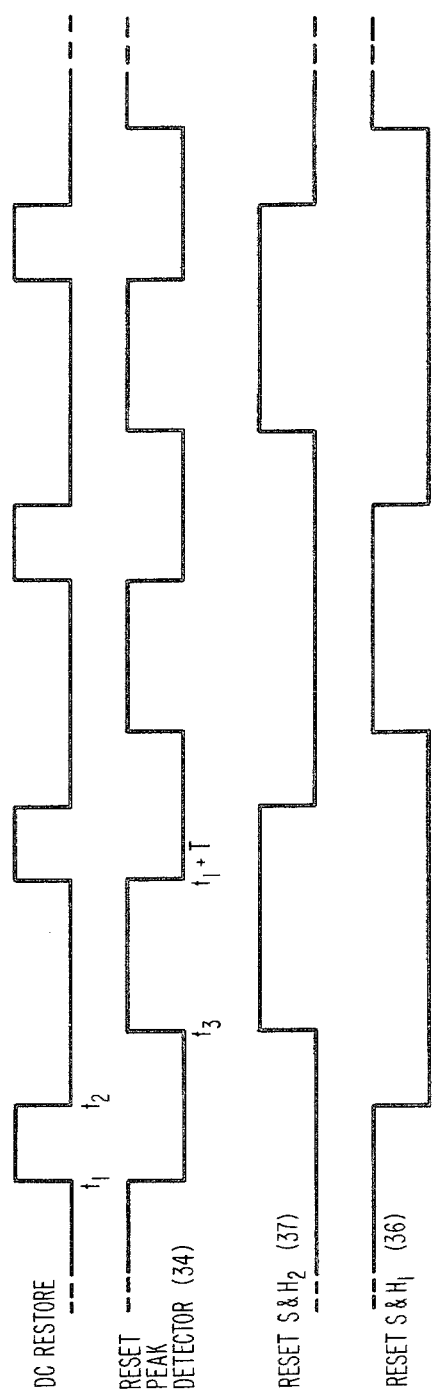
FIG. 4 is a timing diagram of the operation of the circuit of FIG. 2.

FIG. 4 shows a timing diagram for the operation of the circuit of FIG. 1. The detection interval is selected as time $t_1$ to $t_2$. The peak voltage is sensed during this interval, and the peaks are latched in alternate cycles by sample and hold circuits 36 and 37. The sample and hold circuits retain the peaks sensed in adjacent field cycles K and K−1. If we adopt the convention that B represents the voltage output of the peak detector, then $B_{K-1}$ and $B_K$ are representations of that peak voltage during adjacent field cycles. The difference voltage $C_K$ taken during interval $t_2$ to $t_3$ thus is equal to $B_K$ minus $B_{K-1}$ at the output of amplifier 39. Since $C_K$ is a three-level response, the outputs of the positive (40) and negative (41) level comparators are ANDed to get an output $A_K$ at 45 $=(C_K)$ mod 2. The pulse diagram of FIG. 4 can be seen to produce such operations.

Direct difference encoding has the drawback of possible error propagation since a single decision error can create confusion in the detector. But this problem is eliminated by correlated level encoding of the data before recording data in the magnetic memory chip itself as noted hereinbefore and as now explained.

CORRELATED LEVEL CODING

The original binary data sequence is defined by $\{a_k\}$; $a_k \in \{0,1\}$ for $k \geq 0$. This is to be recorded as transitions between bubble and no-bubble responses in contiguous field cycles in a way that eliminates detector error propagation. This can be accomplished by encoding $\{a_k\}$ into a new binary sequence $\{b_k\}$ by the algorithm $$b_k = a_k \oplus b_{k-1}$$

and $$b_k = 0 \text{ if } k < 0,$$

where $\oplus$ denotes mod 2 binary addition. The sequence $\{b_k\}$ is then recorded as a sequence of bubbles (1's) and no-bubbles (0's). If, in response to $b_k$, $B_k$ is the statistic available to the detector in the detection window on which to base a decision as to the presence of a bubble or no-bubble in the $k^{th}$ cycle; the difference detection is accomplished by making a trinary decision on the analog difference $C_k = B_k - B_{k-1}$ for each contiguous field cycle pair. There are three possible binary outputs corresponding to the detection of $C_k$; these are $c_k \in \{-1, 0, +1\}$. In terms of the binary sequence $\{b_k\}$, $$c_k = b_k - b_{k-1}$$

for $k \geq 0$. From the defining expression for $\{b_k\}$, mod 2 subtraction of $b_{k-1}$ from both sides gives $$(b_k - b_{k-1})_{mod\ 2} = (a_k + b_{k-1} - b_{k-1})_{mod\ 2}.$$

Then $$a_k = (b_k - b_{k-1})_{mod\ 2} = (c_k)_{mod\ 2}.$$

and it follows that $\{a_k\}$ is available by simple logical operations on the trinary sequence $\{c_k\}$ without the problem of error propagation if a detection error occurs. In general, the detector outputs are estimates of $\{c_k\}$ based on the available differences $\{C_k\}$. Then the detector output is the sequence of estimates $\{\hat{c}_k\}$, and the estimate of the original data sequence is $$\hat{a}_k = (\hat{c}_k)_{mod\ 2}, k \geq 0.$$

If there are no errors in the detector decisions, $\hat{c}_k = c_k$ and $\hat{a}_k = a_k$. Even if errors do occur, there is no error propagation.

The principles of correlated level coding in magnetic bubble detection may be more clearly explained via an example. In the following, the detection circuit is assumed to sense the peak of the differential sensor response in each detection window, where the response is dc-restored to ground prior to each window. In the $k^{th}$ cycle, $B_k$ is the sensed peak value, and this statistic is used to form $C_k = B_k - B_{k-1}$ in the detector. Bipolar threshold detection on the difference $C_k$ is made to obtain the trinary logic sequence $\{\hat{a}_k\}$.

Figure 5:
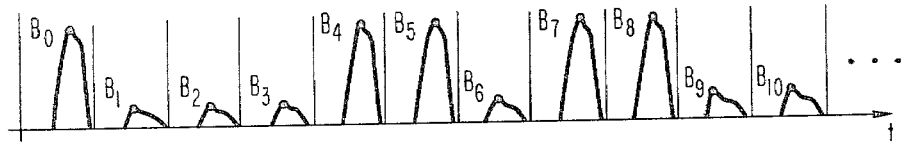
FIG. 5 is a chart showing example of correlated coding.
Figure 5:
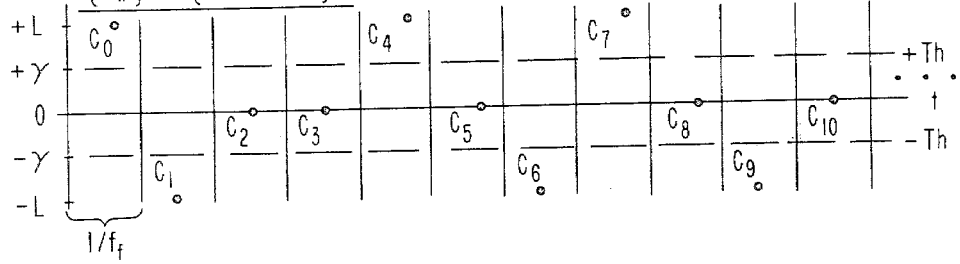

An arbitrary data sequence $\{a_k\}$, with $a_k \in \{0,1\}$ for $k = 0,1,2 \ldots$ is assumed in FIG. 2 for bubble recording. Then $b_k = a_k \oplus b_{k-1}$ is generated as the actual recorded sequence by exclusive OR logic with $b_{-1}$ initialized to 0. The dc restored responses for $b = 1$ (bubble) and $b = 0$ (no-bubble) are also shown in FIG. 5 with the peaks $\{B_k\}$ and the differences $\{C_k\}$. Bipolar thresholding yields $\{c_k\}$, and $\{a_k\}$ follows by taking the absolute value. In this example, no errors have been assumed to occur in the decisions that generate $\{c_k\}$. If the decisions are not perfect, the recovered sequence is $\{\hat{c}_k\}$, and the recovered data is $\{\hat{a}_k\}$. Detection errors will not propagate as can be seen by assuming $C_k$ is incorrectly detected in a cycle for this example.

This example should clarify the coding mechanics, but it is not meant to imply that correlated level coding for magnetic bubble detection is limited to decisions on differences of dc restored signal peaks. Many signal processing approaches can be used to obtain sufficient statistics to detect $\{\hat{c}_k\}$.

Amplifier 39 and comparators 40 and 41 of FIG. 2 can be replaced by an absolute value circuit with differential inputs and a single comparator to obtain $$\hat{A}_k = (\hat{C}_k)_{mod\ 2} = C_k.$$

Direct accessability of positive and negative comparator outputs can be used to detect certain detector errors. For example, it is not possible to have consecutive positive or negative steps in $C_k$ since $\{B_k\}$ is a bilevel sequence and $C_k = B_k - B_{k-1}$. A simple logic circuit can monitor the dual comparator outputs for these and other detectable error events. But by taking the absolute value before comparison, this error information will be lost.

I claim:

1. A magnetic bubble memory including a layer in which magnetic bubbles can be moved along a path in response to a periodic drive field and a first detector coupled to said path for providing first and second output signals responsive to the presence and absence of a magnetic bubble at said first detector during a detection interval, said memory being characterized by a detection circuit responsive to the outputs from said detector during consecutive ones of said detection intervals for providing first and second amplified signals representative of different and like output signals respectively during consecutive ones of said detection intervals.

2. A magnetic bubble memory in accordance with claim 1 including a second detector connected into a bridge arrangement with said first detector between two ports, wherein said detection circuit includes a first differential amplifier connected between said ports and adapted to provide first and second amplified signals representative of first and second differences between the outputs of said first and second detectors.

3. A magnetic bubble memory in accordance with claim 2 wherein said detection circuit also includes a dc restore circuit connected to said amplifier and adapted to establish a reference level for the output of said amplifier.

4. A magnetic bubble memory in accordance with claim 3 also including a peak detector connected to said first differential amplifier and adapted to provide a peak signal when said amplified signal reaches a maximum amplitude during a detection interval.

5. A magnetic bubble memory in accordance with claim 3 also including an even and an odd sample and hold circuit each adapted for establishing an output signal level in response to a peak signal occurring in an odd or an even cycle of said periodic drive field respectively, said sample and hold circuits being adapted for holding said output signal levels for one cycle of said periodic drive field.

6. A magnetic bubble memory in accordance with claim 5 also including a second differential amplifier connected to said sample and hold circuits and adapted to provide during each of said detection intervals third and fourth amplified signals representative of first and second differences between the outputs of said sample and hold circuits.

7. A magnetic bubble memory in accordance with claim 5 also including a comparator circuit arrangement connected between the output of said second differential amplifier and inputs to an AND circuit, said comparator circuit arrangement being adapted to provide first and second outputs representative of the presence and absence of a difference between consecutive outputs of said second differential amplifier.

8. A magnetic bubble memory in accordance with claim 7 wherein said comparator circuit arrangement includes first and second comparators connected electrically in parallel between the output of said second differential amplifier and inputs to said AND circuit, said comparators having positive and negative thresholds respectively and being adapted to provide a null for outputs from said second differential amplifier which are less than the difference between said thresholds and first and second data signals in response to outputs from said second differential amplifier which exceed said positive and negative thresholds respectively.

9. A detection circuit for a magnetic bubble memory including at least a first and second magnetic bubble detector connected in a bridge network between first and second ports and adapted to provide first and second output signals during a detection interval for the presence and absence of a bubble respectively, a differential amplifier connected between said ports for providing an amplified signal representative of the difference between the output signals from said detectors during each detection interval, and a peak sensor for providing a peak signal indicative of the maximum amplitude of said amplified signal during each detection interval, said detection circuit being characterized by means for providing first and second reference signals in response to a change or a no-change indication respectively between ones of said amplified signals provided during first and second consecutive ones of said detection intervals.

* * * * *